United States Patent [19]

Clark

[11] Patent Number: 5,177,480
[45] Date of Patent: Jan. 5, 1993

[54] DATA COMMUNICATION HAVING TRANSMITTER-CONTROLLED MODE SWITCHING FROM COMPRESSED-TO-TRANSPARENT MODE BUT LOCAL SYNCHRONOUS TRANSMITTER-CONTROLLED AND RECEIVER-CONTROLLED MODE SWITCHING FROM TRANSPARENT-TO-COMPRESSED MODE

[75] Inventor: Alan D. Clark, Ipswich, England

[73] Assignee: British Telecommunications public limited company, Great Britain

[21] Appl. No.: 898,356

[22] Filed: Jun. 12, 1992

Related U.S. Application Data

[63] Continuation of Ser. No. 688,553, Jun. 25, 1991, abandoned.

[30] Foreign Application Priority Data

Dec. 7, 1988 [GB] United Kingdom .................. 8828499
Dec. 7, 1989 [GB] United Kingdom ...PCT/GB89/01465

[51] Int. Cl.$^5$ ............................................. H03M 7/48
[52] U.S. Cl. ...................................................... 341/51
[58] Field of Search ............................ 341/51, 87, 95

[56] References Cited

U.S. PATENT DOCUMENTS

| | | | |
|---|---|---|---|
| 3,185,824 | 5/1965 | Blasbalg et al. | 341/63 |
| 3,394,352 | 7/1968 | Wernikoff | 341/51 |
| 4,509,038 | 4/1985 | Hirano | 341/67 |

OTHER PUBLICATIONS

Patent Abstracts of Japan, vol. 13, No. 186 (E-752) (3534), May 2, 1989; & JP, A, 112621 (NEC Corp.).

*Primary Examiner*—Howard L. Williams
*Attorney, Agent, or Firm*—Nixon & Vanderhye

[57] ABSTRACT

A method of processing data for transmission from a transmitter (T) to a receiver (R) both of which are switchable between a compression mode in which the data stream is encoded or decoded with a data compression algorithm and a transparent mode in which the data stream is transmitted or received unencoded, comprising reading an input data stream at the transmitter (T), encoding at least part of the input data stream with the data compression algorithm to form a compressed data stream, monitoring the efficiency of compression of the compressed data stream and controlling the switching of the mode of the transmitter (T) and receiver (R) so that the input data stream is transmitted efficiently. In the transparent mode both the receiver and the transmitter check independently the efficiency of compression and switch to the compression mode if the transparent mode is determined to be inefficient. In the compression mode the transmitter (T) determines the efficiency of compression and transmits a control code to the receiver (R), switching both the receiver and transmitter to the transparent mode if the compression mode is determined to be inefficient.

16 Claims, 1 Drawing Sheet

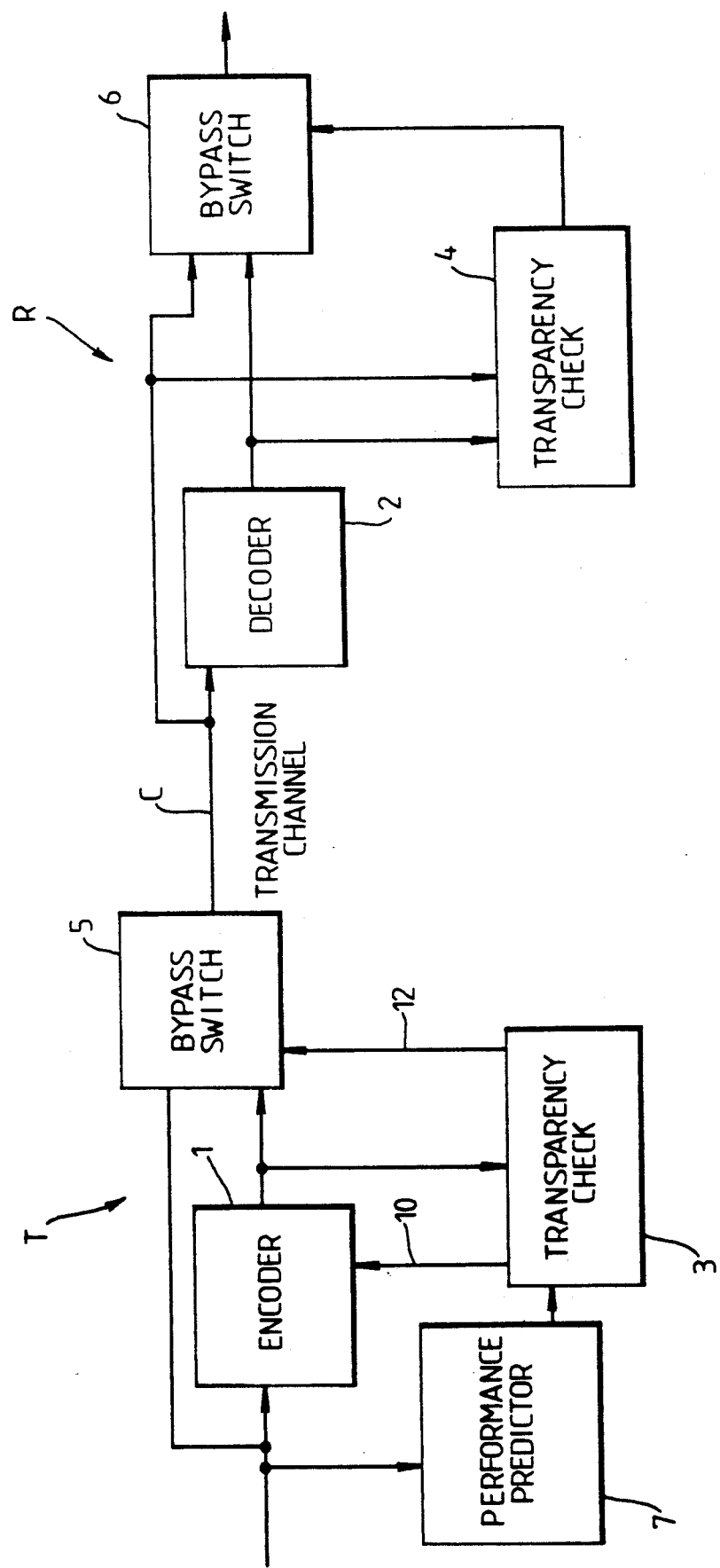

DATA COMMUNICATION HAVING TRANSMITTER-CONTROLLED MODE SWITCHING FROM COMPRESSED-TO-TRANSPARENT MODE BUT LOCAL SYNCHRONOUS TRANSMITTER-CONTROLLED AND RECEIVER-CONTROLLED MODE SWITCHING FROM TRANSPARENT-TO-COMPRESSED MODE

This is a continuation of application Ser. No. 07/688,553, filed Jun. 25, 1991, now abandoned.

The present invention relates to data compression systems. Most useful forms of data have a significant degree of redundancy and as a result it is often advantageous to use a data compression system to encode the data in such a way that redundant signals are eliminated, thereby reducing the space needed to store the data or reducing the bandwidth required to transmit the data.

It is known to use a method of processing data for transmission from a transmitter to a receiver both of which are switchable between a compression mode in which data stream is encoded or decoded with a data compression algorithm and a transparent mode in which the data stream is transmitted or received unencoded, comprising reading an input data stream at the transmitter, encoding at least part of the input data stream with the data compression algorithm to form a compressed data stream, monitoring the efficiency of compression of the compressed data stream and controlling the switching of the mode of the transmitter and receiver so that the input data stream is transmitted efficiently.

There is a significant overhead associated with the use of data compression algorithms and as a result in those parts of an input data stream which have a low degree of redundancy the use of the compression algorithm can result in a compression ratio less than unity, that is the "compressed" data occupies more space than the uncompressed data. It has been proposed to use methods of compression such as that described above in which the efficiency of the compression process is monitored and the transmitter and receiver are switched between a compression mode in which the data is encoded using a compression algorithm and a transparent mode in which the data is transmitted without compression as appropriate to ensure maximum efficiency. In one such system the contents of an entire data buffer are encoded using a data compression algorithm and the resulting data examined to determine whether it does in fact occupy less space. The data from the shorter of the compressed/uncompressed buffers is then transmitted together with a header which indicates whether the transmitted data is compressed or not. The decoder at the receiver then operates in the transparent or the compressed mode according to the value of the header. This scheme has the disadvantage that it is inflexible since it can only operate on complete buffers and is inefficient when there are are significant variations in the nature of the data within a single buffer. The need to encode an entire buffer before transmission introduces a significant delay and moreover there is a significant overhead associated with all data since uncompressed data still needs to be prefixed with a code to indicate that the receiver should operate in the transparent mode. As an alternative to accumulating an entire buffer before determining whether the compressed or transparent mode is appropriate schemes have also been proposed in which a sample from the beginning of the data stream is tested to determine which method of transmission is most efficient and the rest of the data stream transmitted and received in the compression or transparent mode according to the results of that determination on the sample. This implementation of the method outlined above suffers the disadvantage that the overall efficiency of transmission can be seriously affected if the initial sample from the data stream is unrepresentative of the data as a whole.

According to the present invention, in such a method in the transparent mode both the receiver and the transmitter check independently the efficiency of compression and switch to the compression mode if the transparent mode is determined to be inefficient, and in the compression mode the transmitter determines the efficiency of compression and transmits a control code to the receiver, both the receiver and transmitter thereby switching to the transparent mode if the compression mode is determined to be inefficient.

The transmission of additional characters from the transmitter to the receiver to provide control codes which switch the receiver to between modes has a serious effect on the efficiency of the transmission system when the system is operating in the transparent mode. In the compression mode by contrast the use of the compression algorithm frees bandwidth on the transmission channel which can be used for the control codes. The present inventor has found that significant advantages arise from the method of the present invention, in which when in the transparent mode the transmitter and receiver monitor the efficiency of compression independently and so switch between modes where appropriate without requiring the transmission of control codes, but when the system is in the compression mode the transmitter transmits a code to cause the receiver to switch between modes so that the state of the receiver is dependent upon the state of the transmitter. The provision of dependent switching when the system is in the compression mode enables the method of the present invention to take advantage of the fact that the transmitter, unlike the receiver, has access to data which has not yet been transmitted and can look ahead to detect changes in the data characteristics and where appropriate elect to switch to the transparent mode before the performance of the system deteriorates. Prompt switching between modes has found to be critical in the compression mode where a compression ratio less than unity can result in a severe degradation in performance. In the transparent mode by contrast, the compression ratio is fixed at unity, providing a lower limit on the efficiency of the system.

Preferably in the transparent mode both the receiver and transmitter determine independently the efficiency of compression of current data and in the compression mode the transmitter determines the efficiency of compression of untransmitted data in the data stream. Preferably the transmitter and receiver determine the efficiency of compression of the current data by comparing the size of a sequence of data symbols from the current data before and data compression and the transmitter determines the efficiency of compression of untransmitted data from the data stream by calculating from the untransmitted data a parameter indicative of its compressibility.

The data compression algorithm employed by the receiver and transmitter in the compression mode may be non-adaptive so that the code words allocated to given input symbols are predetermined but preferably the data compression algorithm is adaptive, the code words allocated to input symbols being modified in accordance with the characteristics of the data stream.

A system in accordance with the present invention will now be described in detail with reference to the FIGURE of the accompanying drawings which is a block diagram showing a receiver and transmitter suitable for use in the method of the present invention.

A data transmission system comprises a transmitter T linked via a transmission channel C to a receiver R. The transmission channel C may be provided by an GSTN linking remote stations housing the transmitter T and receiver R respectively or may comprise a mass storage device to which the transmitter T writes data and from which the receiver R reads data. In this latter case the transmitter T and receiver R are formed in a single device.

The transmitter T includes an encoder 1 and a bypass switch 5. When the transmitter T is in a compression mode data from the input is fed to the encoder 1 where it is encoded using a data compression algorithm. In the present example the algorithm used is the well known Huffman code described in the paper "A Method for the Construction of Minimum Redundancy Codes" by D.A. Huffman, proceedings of the IRE, Vol. 40, 9 1952. A decoder 2 in the receiver R decodes the received data using a complementary algorithm.

In transparent modes bypass switches 5,6 in the transmitter and receiver operate to bypass the encoder and decoder so that data is transmitted and received in uncompressed form. Both the transmitter T and receiver R include transparency checking mechanisms 3,4 which, in the manner more fully described below, determine the efficiency of compression of the current data handled by the encoder and decoder. The transmitter includes in addition a performance predictor 7 which analyses data in advance of its encoding. The performance predictor 7 provides output for the transparency check mechanism 3 to cause the system to switch between modes when a change in the nature of the data is detected.

In use, the system starts in transparent mode, the transmitter bypass switch 5 selecting the input data and the decoder bypass switch accepting unencoded data from the transmission channel C. The transparency checking mechanisms 3, 4, in both the receiver and transmitter carry out independently the following procedure.

(i) Identify a known starting point, e.g. the start of the message
(ii) Count the number of bits transmitted since the starting point
(iii) Calculate the number of bits that would have been transmitted if compression had been applied
(iv) At predetermined intervals compare the results of steps (ii) and (iii)
(v) If the number of bits from (iii) is less than the number of bits from (ii) switch to compression mode and begin transmitting/receiving the data in compressed form.

In compression mode the encoder compresses the data stream prior to transmission and the decoder performs the reverse function. The transparency checking mechanism in the transmitter carries out the following steps:

(i) Identify a known starting point
(ii) Count the number of bits transmitted
(iii) Calculate the number of bits that would have been transmitted if compression had not been applied
(iv) At predetermined intervals compare the results of step (ii) with the results of step (iii)
(v) If the number of bits from (iii) is less than the number of bits from (ii) transmit an explicit code word to the decoder to signal transition to transparent mode, and begin transmitting the data in uncompressed form.

The performance predictor 7 in the transmitter carries out the following steps when the system is in the compression mode:

(i) Examine the data as yet untransmitted for characteristics that indicate that the performance of the data compression encoder may be degraded
(ii) If the test applied in (i) indicates that the performance would be degraded if the encoder remains in compressed mode transmit an explicit code word to the decoder to signal transition to transparent mode and begin transmitting the data in uncompressed form.

In compression mode the decoder:
(i) receives and decodes code words
(ii) when an explicit code word is received indicating that a transition to transparent mode is being made switches to transparent mode The system outlined above provides improved efficiency in both transparent and compressed modes. In compressed mode the encoder looks ahead for changes in the data characteristics and can elect to switch to transparent mode before performance deteriorates. In transparent mode no transmitted bandwidth is wasted on explicit signals transmitted between the transmitter and receiver to indicate the change of state.

Alternative arrangements are possible in which both transmitter and receiver rely solely upon checks carried out on current data without use of a predictive function.

As outlined above the transparency check function 3 in the transmitter counts the number of bits entering the encoder 1 and the number of bits leaving the encoder 1. After a pre-defined interval, which in the present example comprises 256 input characters, the two counts are compared and if the number of bits leaving the encoder is less than the number of bits entering it then the bypass switch 5 is switched by means of a control lead 12 to accept input from the encoder 1 thereby from that instant onwards transmitting the compressed data stream over the transmission channel.

The transparency checking mechanism 4 in the receiver performs an equivalent function to that in the transmitter in transparent mode and may optionally do so as well in compression mode. The transparency checking mechanism 4 includes a copy of the encoder function which it uses to calculate the same count of encoded and unencoded bits as the corresponding transparency checking mechanism 3 in the encoder. The two transparency checking mechanisms 3, 4 employ identical logical decision functions and so switch from transparent to compressed modes at identical points within the transmitted bit stream.

The performance predictor 7 in the transmitter may take a number of different forms, but in the present example counts the frequency of occurrence of the characters within the input data stream in advance of their being encoded and calculates the following prediction function which produces an output dependent on the average length of the characters:

(i) Let the input characters be drawn from the set c[0]..c[n] and let the character size be S bits (typically 7 or 8 bits)

(ii) Let the counted occurrence frequency for each character be f[0]..f[n]

(iii) Let the codeword length used within the encoder (1) for each character be L[0]..L[n] bits (iv) Let Sum (x[i]) represent the sum for i=0 to n of x[i]

(v) Calculate A=Sum(f[i].L[i])/Sum(f[i])

If the value of A is greater than the number of input characters then the encoder performance would deteriorate and the transparency check function 3 signals via a control lead 10 that the encoder 3 should emit a special control codeword. After emitting the special control codeword the bypass switch 5 is switched to accept uncompressed input data and the transmitter enters the transparent state.

On receiving the special control codeword the receiver discards the codeword, switches the bypass switch 6 to accept undecoded input data and enters the transparent state.

Although the scheme is described above with reference to the Huffman algorithm which is non-adaptive the present invention may equally be used with adaptive compression systems in which the codewords assigned in the compression mode are varied to suit the current characteristics of the data stream. In this case the predictive function is varied appropriately to match the encoding function used.

I claim:

1. A method of processing data for transmission from a transmitter to a receiver, both of which are switchable between a compression mode in which a data stream is encoded or decoded with a data compression algorithm and a transparent mode in which the data stream is transmitted or received unencoded, said method comprising:

reading an input data stream at the transmitter, encoding at least part of the input data stream with the data compression algorithm to form a compressed data stream, monitoring the efficiency of compression of the compressed data stream and controlling the switching of the mode of the transmitter and receiver so that the input data stream is transmitted efficiently, in which, in the transparent mode, both the receiver and the transmitter check independently the efficiency of compression and each switches itself to the compression mode if the transparent mode is locally determined to be inefficient, and in the compression mode, only the transmitter determines the efficiency of compression and transmits a control code to the receiver if efficiency is lost, both the receiver and transmitter thereby switching to the transparent mode in response to the transmitter-generated efficiency determination if the compression mode is determined to be inefficient by the transmitter.

2. A method according to claim 1, in which in the compression mode the transmitter monitors the efficiency of compression of untransmitted data in the data stream.

3. A method according to claim 2, in which the transmitter monitors the efficiency of compression of untransmitted data in the data stream by calculating from the untransmitted data a parameter indicative of its compressibility.

4. A method according to claim 1, in which the transmitter and receiver monitor the efficiency of compression of current data by comparing the size of a sequence of data symbols from the current data before and after compression.

5. A method according to claim 1, in which the data compression algorithm is non-adaptive so that the code words allocated to given input symbols are predetermined.

6. A method according to claim 1, in which the data compression algorithm is adaptive, the code words allocated to input symbols being modified in accordance with the characteristics of the data stream.

7. A method of effecting efficient data communication from a data transmitter to a data receiver, which communication alternates between (i) an uncompressed or transparent mode and (ii) a compressed mode, said method comprising the steps of:

(a) switching the data transmitter from the compressed to the transparent mode of data transmission based on locally detected loss of data compression efficiency at the transmitter site and also transmitting to the receiver a code indicative of such switched transmission mode;

(b) switching the data receiver from the compressed to the transparent mode of data reception based on detection of said code in received data; and (c) independently but synchronously switching the data receiver and data transmitter from the transparent to the compressed mode of data transmission and data reception respectively based on detected loss of data transmission efficiency in the transparent mode as locally detected by each of the data receiver and data transmitter.

8. A method as in claim 7 wherein step (a) comprises monitoring the data compression efficiency by deriving from as yet untransmitted data a parameter indicative of its compressibility.

9. A method as in claim 7 wherein step (c) comprises monitoring the possibility of increased data transmission efficiency by comparing the size of a transparently transmitted data sequence with that which would have resulted from compression of the same data.

10. A method as in claim 7 wherein said data compression is a non-adaptive compression such that code words allocated to given respectively associated input symbols are predetermined.

11. A method as in claim 7 wherein said data compression is adaptively performed such that code words allocated to respectively associated input symbols are modified as a function of characteristics of the data stream to be transmitted.

12. Apparatus for effecting efficient data communication from a data transmitter to a data receiver, which communication alternates between (i) an uncompressed or transparent mode and (ii) a compressed mode, said apparatus comprising:

(a) means at the transmitter for switching from the compressed to the transparent mode of data transmission at the transmitter site based on locally detected loss of data compression efficiency and for transmitting a code indicative of such switched transmission mode;

(b) means at the receiver for switching from the compressed to the transparent mode of data reception at the receiver site based on detection of said code in received data; and (c) means at the transmitter and means at the receiver, each receiver for synchronously switching from the transparent to the compressed mode of data transmission and reception at the transmitter and receiver sites respectively based on locally detected loss of data transmission efficiency in the transparent mode.

13. Apparatus as in claim 12 wherein the means at the transmitter comprises means for monitoring the data compression efficiency by deriving from as yet untransmitted data a parameter indicative of its compressibility.

14. Apparatus as in claim 12 wherein the means at the transmitter and means at the receiver for synchronously switching each comprises means for monitoring the possibility of increased data transmission efficiency by comparing the size of a transparently transmitted and received data sequence respectively with that which would have resulted from compression of the same data.

15. Apparatus as in claim 12 wherein said means at the transmitter includes non-adaptive data compression means allocating predetermined code words to given respectively associated input symbols.

16. Apparatus as in claim 12 wherein said means at the transmitter includes adaptive data compression means allocating code words to respectively associated input symbols as a function of characteristics of the data stream to be transmitted.

* * * * *